(12) United States Patent
Do

(10) Patent No.: US 6,980,476 B2
(45) Date of Patent: Dec. 27, 2005

(54) MEMORY DEVICE WITH TEST MODE FOR CONTROLLING OF BITLINE SENSING MARGIN TIME

(75) Inventor: Chang-Ho Do, Ichon-shi (KR)

(73) Assignee: Hynix Semiconductor Inc, (KR)

( * ) Notice: Subject to any disclaimer, the term of this patent is extended or adjusted under 35 U.S.C. 154(b) by 0 days.

(21) Appl. No.: 10/746,524

(22) Filed: Dec. 24, 2003

(65) Prior Publication Data

US 2004/0218438 A1 Nov. 4, 2004

(30) Foreign Application Priority Data

Apr. 30, 2003 (KR) ........................ 10-2003-0027610

(51) Int. Cl.[7] ............................................. G11C 29/00
(52) U.S. Cl. ...................... 365/201; 365/205; 365/233
(58) Field of Search ............................... 365/201, 205, 365/233

(56) References Cited

U.S. PATENT DOCUMENTS

| 5,596,538 A | * | 1/1997 | Joo ............................ 365/201 |
| 6,038,180 A | | 3/2000 | Hoshi |
| 6,304,486 B1 | | 10/2001 | Yano |

FOREIGN PATENT DOCUMENTS

| JP | 11-039899 | 2/1999 |
| JP | 11-265583 | 9/1999 |
| JP | 13-101868 | 4/2001 |

* cited by examiner

*Primary Examiner*—Huan Hoang
(74) *Attorney, Agent, or Firm*—Blakely, Sokoloff, Taylor & Zafman

(57) ABSTRACT

A semiconductor memory device includes a memory cell connected to a bit line and a word line; a loading unit for loading data of the memory cell on the bit line by activating the word line; an amplifying unit for amplifying the loaded data of the bit line in response to a sense amplifier enable signal; and a unit for activating the sense amplifier enable signal to have a sensing margin time at a normal mode or to have an adjusted sensing margin time at a test mode, wherein the adjusted sensing margin time is determined by a timing when a predetermined input signal is inputted at the test mode.

14 Claims, 12 Drawing Sheets

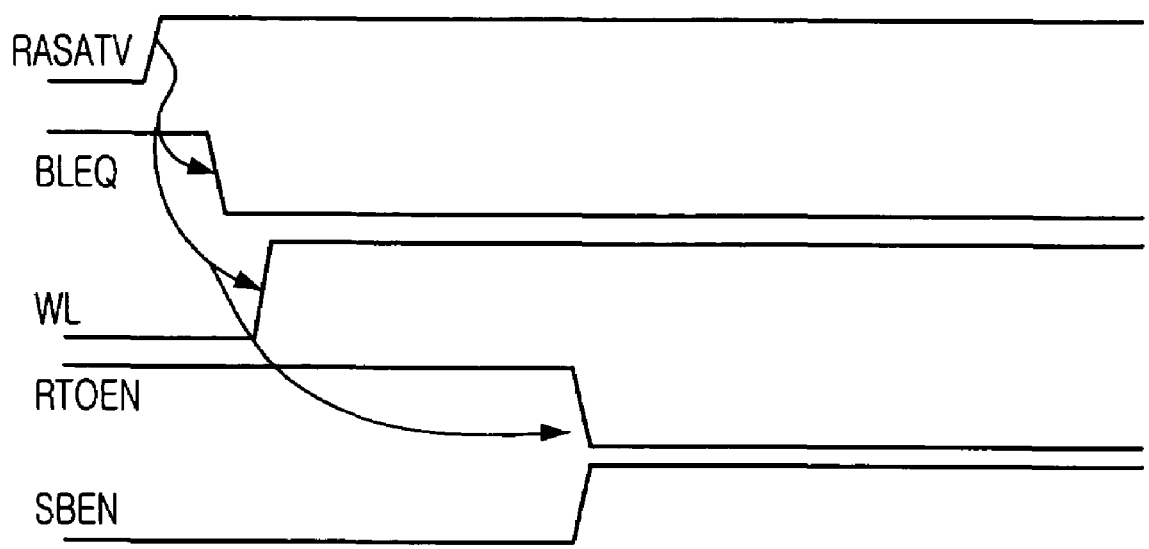
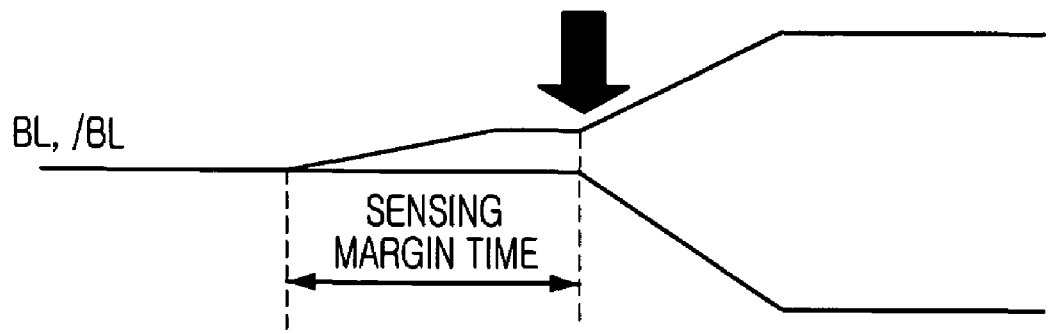
FIG. 2
(PRIOR ART)

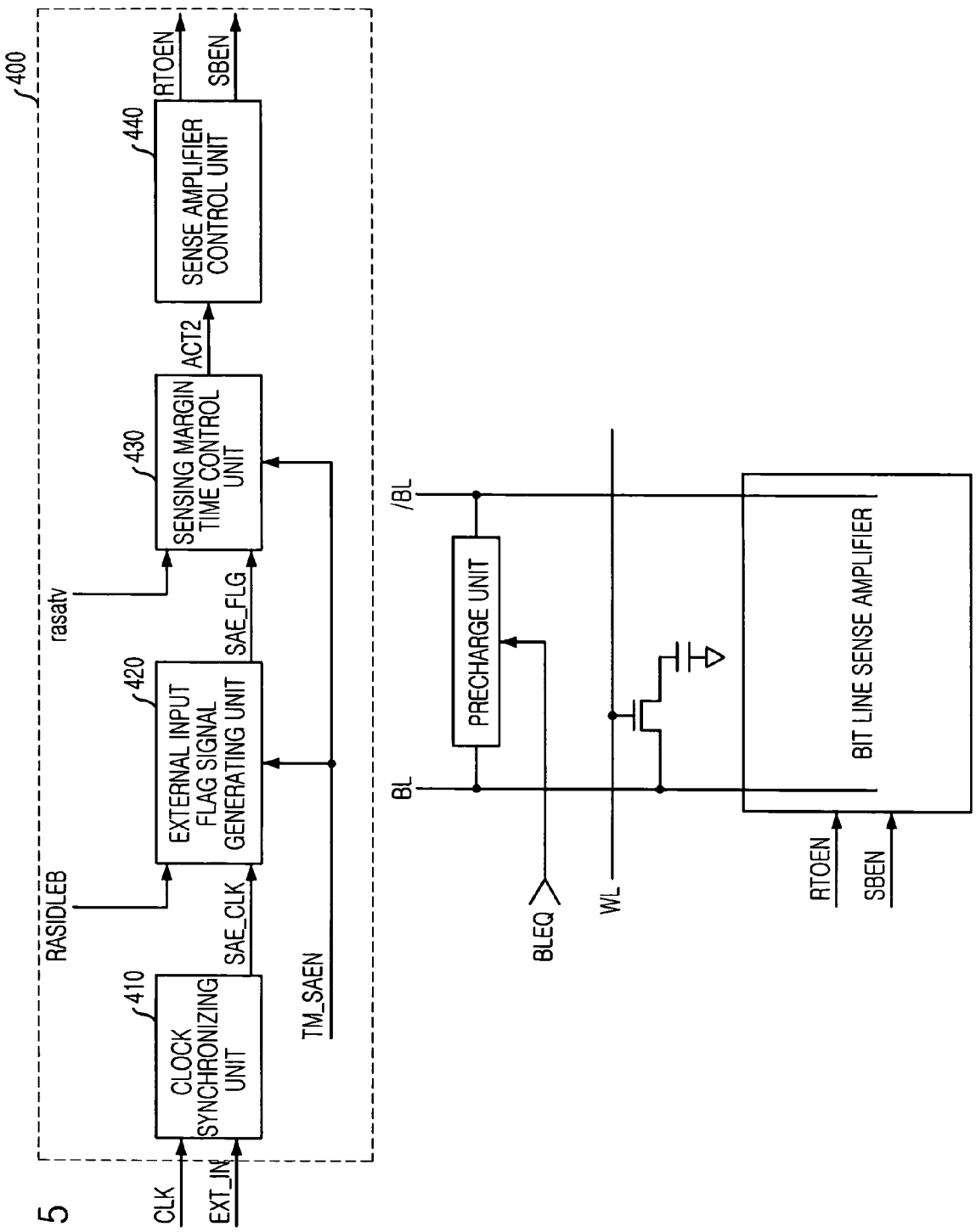

TM_SAEN : 'H' AT TEST MODE
: 'L' AT NON TEST MODE

MEMORY DEVICE WITH TEST MODE FOR CONTROLLING OF BITLINE SENSING MARGIN TIME

FIELD OF INVENTION

The present invention relates to a semiconductor memory device; and, more particularly, to a semiconductor memory device having enhanced ability of controlling a bit line sensing margin time.

DESCRIPTION OF PRIOR ART

A semiconductor memory device such a dynamic random access memory (DRAM) has a sense amplifier which amplifies a small potential difference between bit lines in order to read data from unit cells or refresh data stored in the unit cells. In the process of amplifying the potential difference between the bit lines, there is a sensing margin time, i.e., a set-up time of the sense amplifier until each bit line is supplied with a predetermined voltage level after data begins to be supplied to each bit line. Herein, the predetermined voltage level is a minimum value so that the sense amplifier can sense the voltage difference between the bit lines.

FIG. 1 shows a bit line sense amplifier and circuits connected with the bit line sense amplifier.

As shown, there are a memory cell 100 and a first precharge unit 110. The first precharge unit 110 precharges and equalizes a bit line pair BL and /BL to the level of precharge voltage VBLP in response to a precharge control signal BLEQ. An amplifying unit 120 connected to the bit line pair BL and /BL amplifies a potential difference between the bit line pair BL and /BL.

A first activating voltage RTO and a second activating voltage SB are generated by an activating voltage generating unit 130. The activating voltage generating unit 130 is provided with a second precharge unit 131, a PMOS transistor 132 and an NMOS transistor 133. The second precharge unit 131 precharges and equalizes the first activating voltage RTO and the second activating voltage SB to the level of precharge voltage VBLP in response to the precharge control signal BLEQ. The PMOS transistor 132 raises the first activating voltage RTO to the level of VDD in response to a first enable signal RTOEN. The NMOS transistor 133 lowers the second activating voltage SB to the level of VSS in response to a second enable signal SBEN.

FIG. 2 shows a timing diagram depicting a bit line sensing operation.

Referring to FIGS. 1 and 2, an activated RAS active signal RASATV inactivates the precharge control signal BLEQ and the precharge unit 110 is disabled by the inactivated precharge control signal BLEQ. The bit line pair BL and /BL is floated when the precharge unit 110 is disabled. Then, a word line signal WL of the memory cell 100 is activated. After the sensing margin time, the activating voltage generating unit 130 and the amplifying unit 120 start to act in response to the activated first enable signal RTOEN and the activated second enable signal SBEN.

FIG. 3 is a block diagram showing a conventional synchronous DRAM.

As shown, if external signals including a clock signal CLK, an address signal ADD and a control signal CONTROL are inputted, those signals CLK, ADD and CONTROL are buffered and decoded by a buffer/input decoder 310, and a RAS active signal RASATV is generated from a RAS signal generating unit 320.

Thereafter, in response to the RAS active signal RASATV, a word line timing control unit 330 generates a second control signal ACT1 which controls a word line signal WL, and a sense amplifier timing control unit 360 generates a first control signal ACT0 which controls a precharge control signal BLEQ, and a delay unit 370 generates a third control signal ACT2 which controls a first enable signal RTOEN and a second enable signal SBEN.

Thereafter, in response to the second control signal ACT1, a row address signal ROWADD is decoded by a row decoder 340 and the word line signal WL of the memory cell array 350 is generated from the row decoder 340. In response to the first control signal ACT0, a sense amplifier control unit 380 generates the precharge control signal BLEQ. In response to the third control signal ACT2, the sense amplifier control unit 380 generates the first enable signal RTOEN and the second enable signal SBEN.

Typically, the conventional semiconductor memory device has a test mode to extend the sensing margin time, i.e., it is possible to extend the sensing margin time in order to test a memory chip for a particular purpose. However, once the extended sensing margin time is predetermined, it is not possible to change the sensing margin time freely.

Referring to FIG. 3, a delaying value of the delay unit 370 is extended to a predetermined value different from a normal value if the delay unit 370 operates in the test mode in response to a test mode signal TM-SAEN.

As described above, since the sensing margin time of the conventional semiconductor memory device is set to a particular value, it is not possible to change the sensing margin time freely. Therefore, it is a problem that a particularly requested margin time for a particular test mode can not be achieved. For example, in such a test mode to screen defects of a semiconductor memory device, it is hard to decide where the defects have occurred. One of methods for screening the defects is to extend the sensing margin time to a particular value needed for the test mode.

SUMMARY OF INVENTION

It is, therefore, an object of the present invention to provide a device to control a bit line sensing margin time.

In accordance with an aspect of the present invention, there is provided a memory device including a memory cell connected to a bit line and a word line; a unit for loading data of the memory cell on the bit line by activating the word line; a unit for amplifying the loaded data of the bit line by an enable signal; and a unit for controlling the enable signal so that the signal can be activated after delaying by a set sensing margin time in case of the normal mode or after delaying by an adjusted sensing margin time controlled by an input signal from outside of a chip in case of the test mode.

BRIEF DESCRIPTION OF THE DRAWINGS

The above and other objects and features of the present invention will become apparent from the following description of preferred embodiments taken in conjunction with the accompanying drawings, in which:

FIG. 2 is a timing diagram showing a bit line sensing operation;

FIG. 5 is a block diagram describing a control unit shown in FIG. 4;

DETAILED DESCRIPTION OF INVENTION

Hereinafter, a semiconductor memory device in accordance with the present invention will be described in detail referring to the accompanying drawings.

Figure 1:
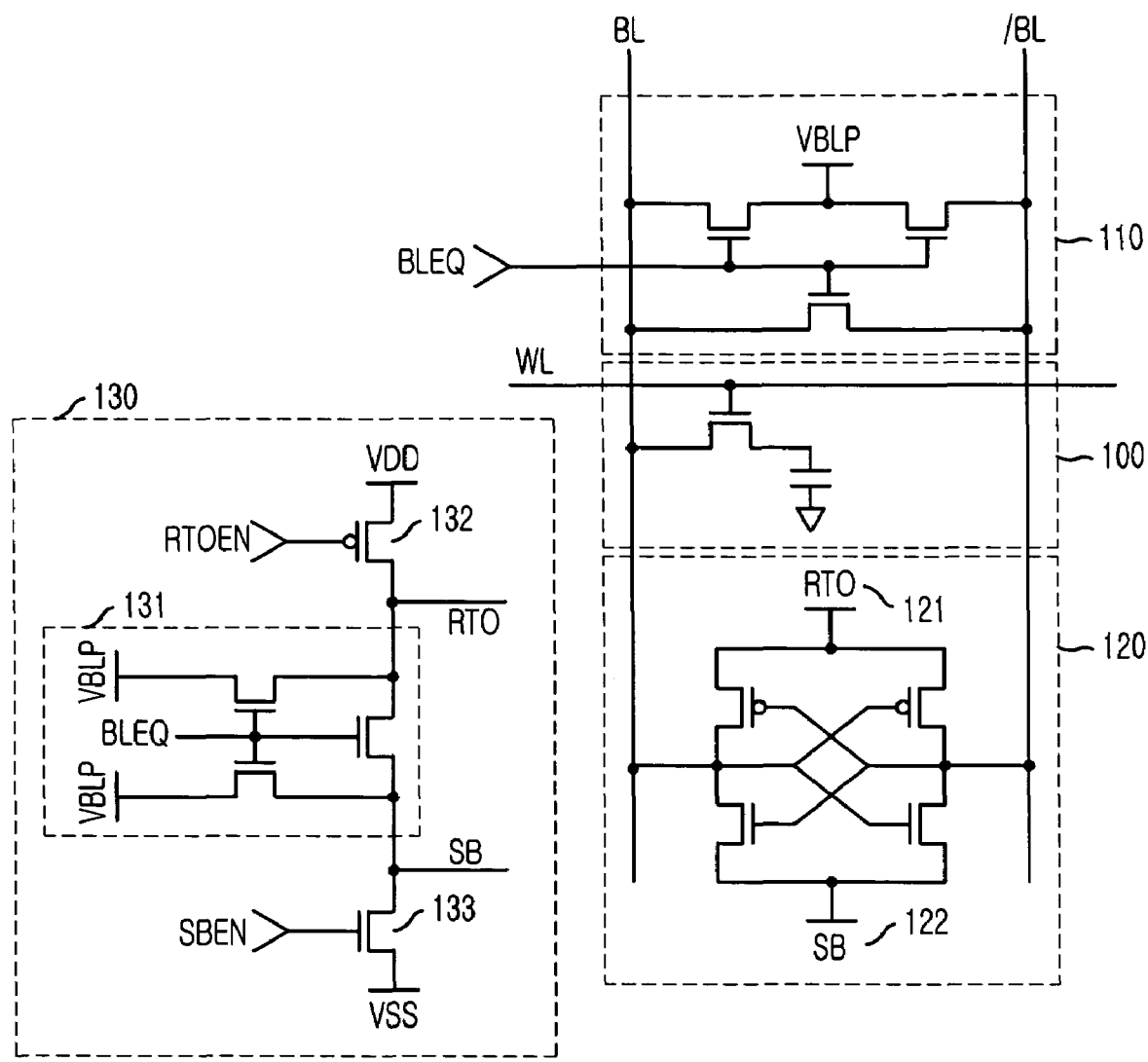
FIG. 1 shows a bit line sense amplifier and other circuits connected to the amplifier.
Figure 3:
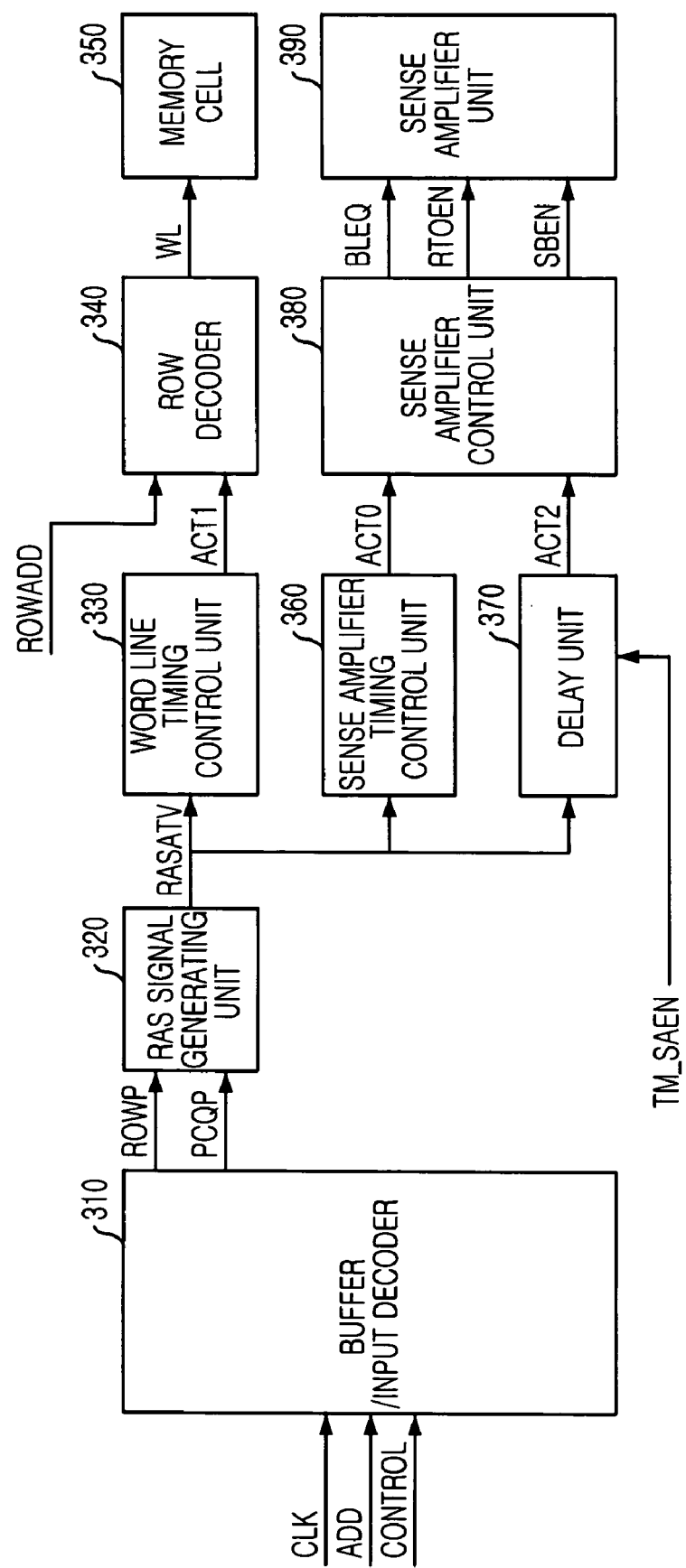
FIG. 3 is a block diagram of a conventional synchronous DRAM showing a process of generating an activating signal for a sense amplifier.
Figure 4:
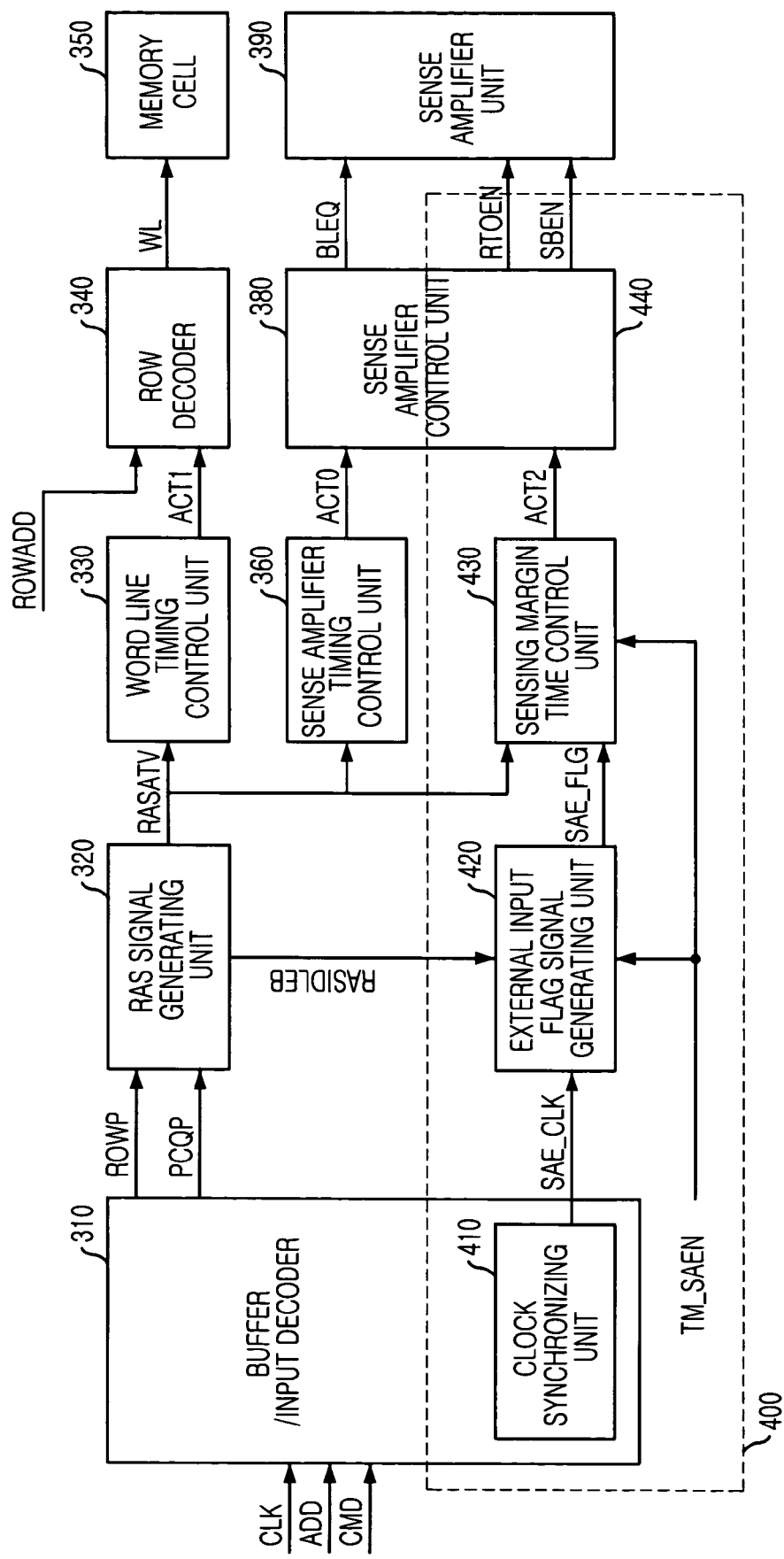
FIG. 4 is a block diagram depicting the semiconductor memory device in accordance with the present invention.

FIG. 4 is a block diagram describing a semiconductor memory device; and, particularly, showing a process of generating signals needed for operating the semiconductor memory device.

As shown, the semiconductor memory device includes a memory cell array 350, a buffer/input decoder 310, a RAS signal generator 320, a word line timing control unit 330, a row decoder 340, a sense amplifier timing control unit 360, a sense amplifier control unit 380, a sense amplifier unit 390 and a control unit 400.

The memory cell array 350 is connected to a bit line and a word line. The blocks 310, 320, 330, 340, 360 and 380 serve to load data on the bit line by floating the bit line and activating the word line. The sense amplifier unit 390 controlled by a first enable signal RTOEN and a second enable signal SBEN amplifies the data of the bit line. The control unit 400 activates the first enable signal RTOEN and the second enable signal SBEN in case of a normal mode or a test mode.

FIG. 5 is a block diagram of the control unit 400. As shown, the control unit 400 includes a clock synchronizing unit 410, an external input flag signal generating unit 420, a sensing margin time control unit 430 and a sense amplifier control unit 440.

The clock synchronizing unit 410 generates a clock synchronizing signal SAE_CLK by synchronizing an external input signal EXT_IN with a clock signal CLK. The external input flag signal generating unit 420 generates an external input flag signal SAE_FLG in response to the clock synchronizing signal SAE_CLK, a test mode signal TM_SAEN and a RAS idle bar signal RASIDLEB. Herein, the RASIDLEB is generated from the RAS signal generator 320 in order to control the the external input flag signal generating unit 420.

The sensing margin time control unit 430, in response to the test mode signal TM_SAEN, generates a third control signal ACT2 corresponding to the external input flag generating signal SAE_FLG in case of the test mode. In case of the normal mode, the sensing margin control unit 430, in response to the test mode signal TM_SAEN, generates the third control signal ACT2 corresponding to the RAS active signal RASATV.

Figure 6A:
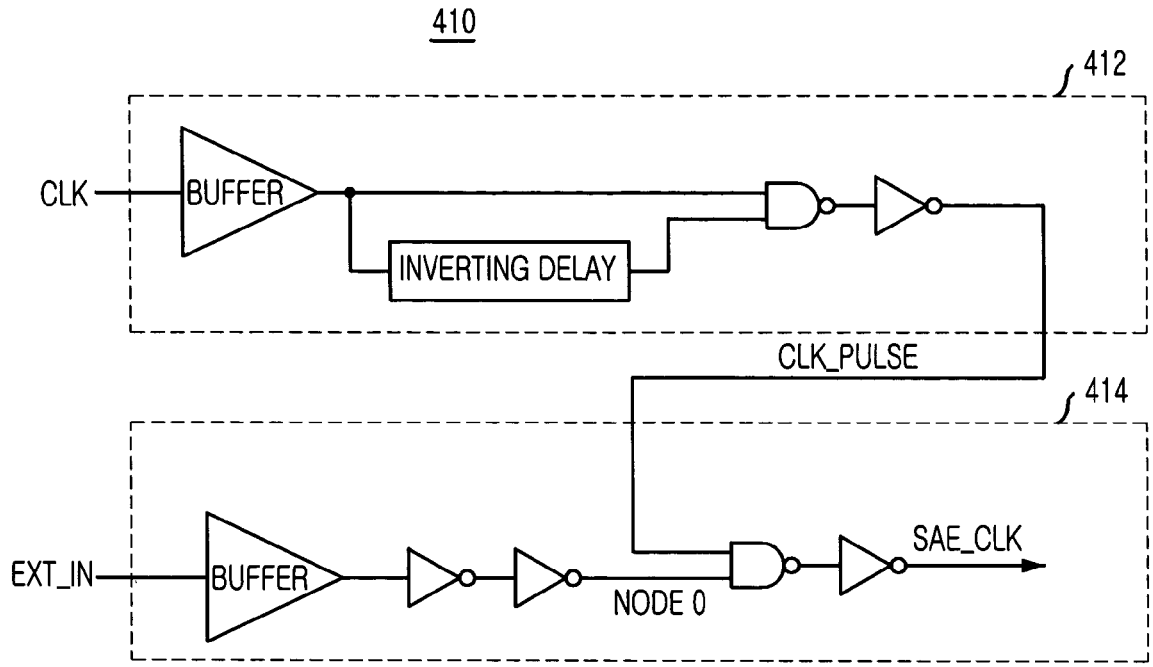
FIGS. 6A and 6B show schematic circuit diagrams of a clock synchronizing unit shown in FIG. 5.
Figure 6B:
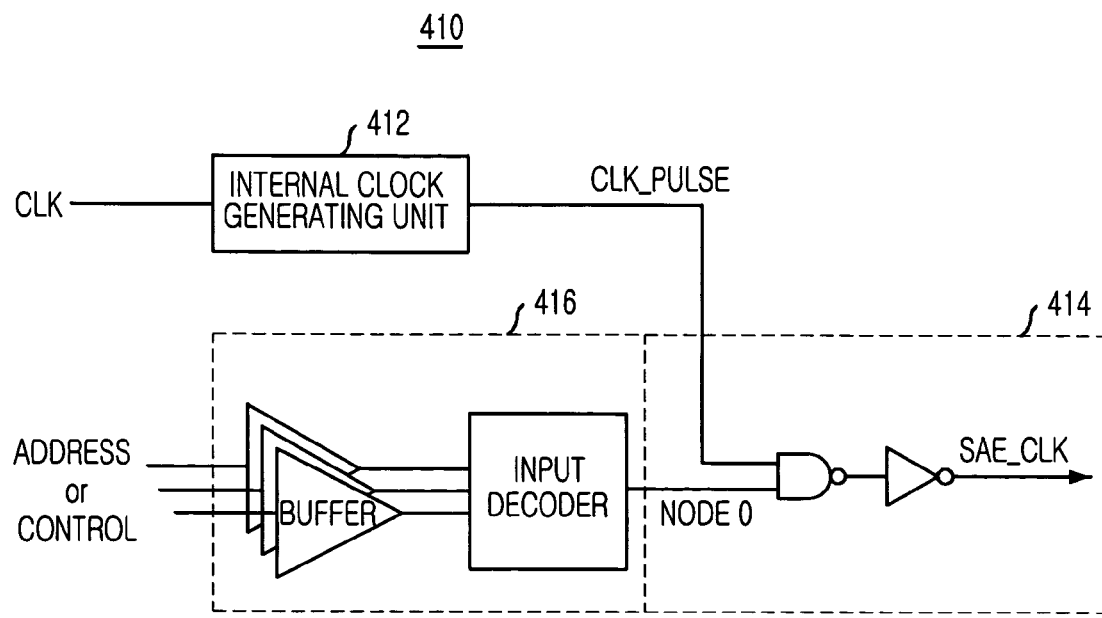

FIGS. 6A and 6B show two different embodiments of a clock synchronizing unit 410 which generates a clock synchronizing signal SAE_CLK.

As shown, the clock synchronizing signal SAE_CLK can be generated by synchronizing an external input signal EXT_IN with a clock signal CLK as shown in FIG. 6A or by synchronizing a plural number of decoded address signal ADDRESS or decoded control signal CONTROL with a clock signal CLK as shown in FIG. 6B.

Referring to FIG. 6A, the clock synchronizing unit 410 includes an internal clock generating unit 412 and a clock synchronizing signal generating unit 414. The clock synchronizing unit 410 generates an internal clock signal CLK_PULSE from a clock signal CLK. The clock synchronizing signal generating unit 414 generates a clock synchronizing signal SAE_CLK by synchronizing an input signal EXT_IN with the internal clock signal CLK_PULSE.

Referring to FIG. 6B, the clock synchronizing unit 410 includes an internal clock generating unit 412, a clock synchronizing signal generating unit 414 and an input unit 416. The input unit 416 generates a mixed signal NODE 0 by mixing an address signal ADDRESS and a control signal CONTROL.

Figure 7:
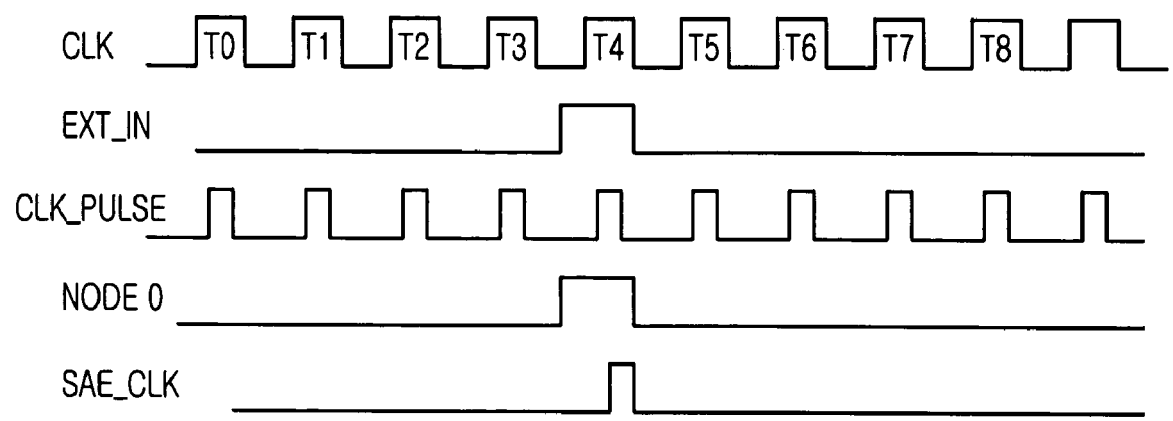
FIG. 7 is a timing diagram showing an operation of a clock synchronizing clock signal shown in FIG. 6.

FIG. 7 is a timing diagram demonstrating operation of the memory device; especially of a clock synchronizing signal SAE_CLK which is activated by an external input signal EXT_IN and a mixed signal NODE 0. As shown, the clock synchronizing signal SAE_CLK is activated at T4.

Figure 8:
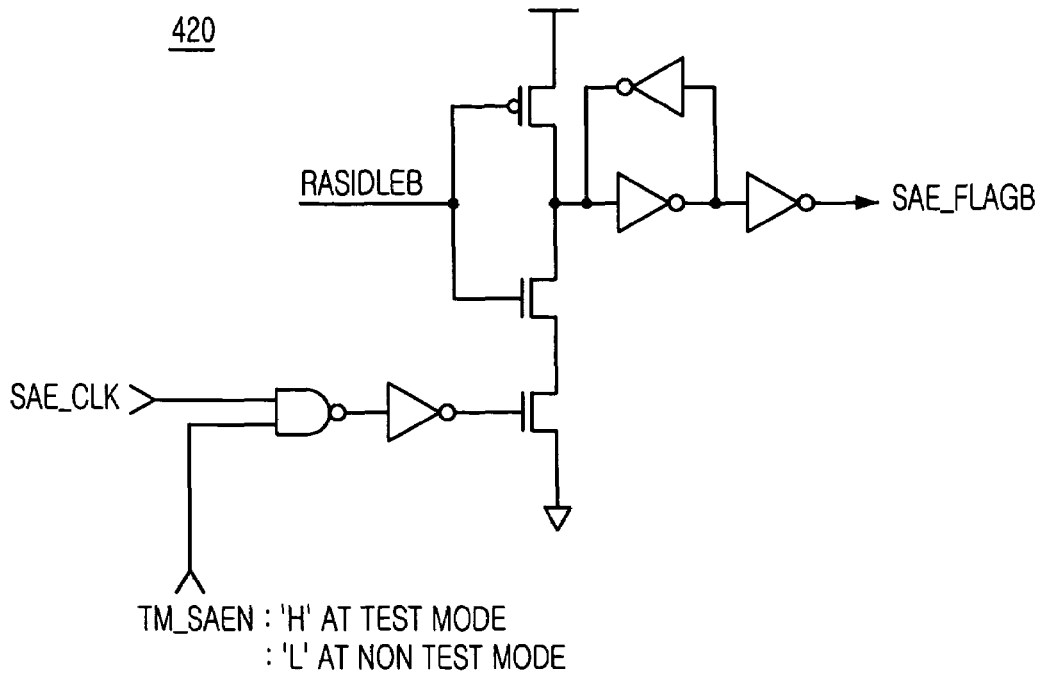
FIG. 8 is a schematic circuit diagram of an external input flag signal generating unit shown in FIG. 2.

FIG. 8 is a circuit of an external input flag signal generating unit 420.

Figure 9:
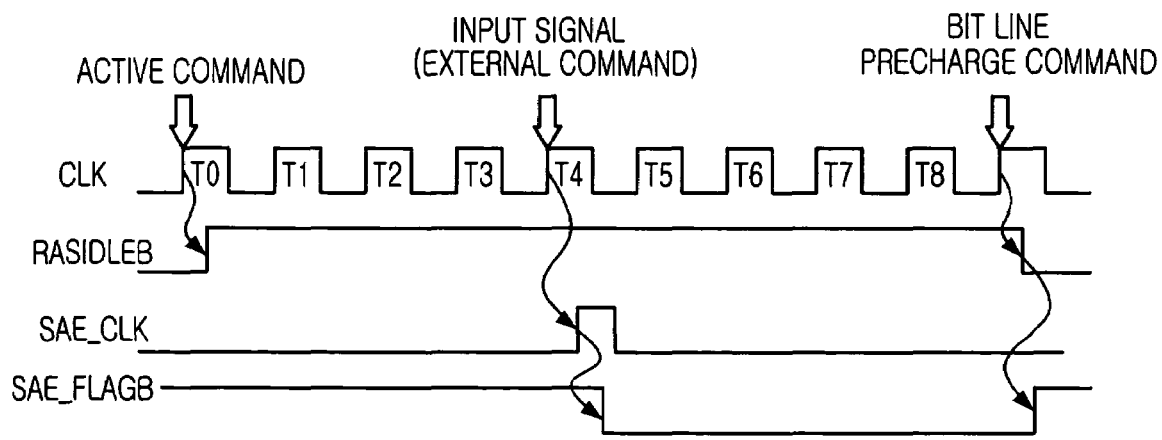
FIG. 9 is a timing diagram showing an operation of the external input flag signal generating unit shown in FIG. 8.

FIG. 9 is a timing diagram demonstrating operation of the memory device at a test mode.

Referring to FIGS. 8 and 9, the external input flag signal generating unit 420, when a test mode signal TM_SAEN is activated as a logic 'H' level, generates an external input flag signal SAE_FLAGB latching a RAS idle bar signal RASIDLEB at point of time when a clock synchronizing signal SAE_CLK is activated. The signal SAE_FLAGB is disabled as a logic 'H' level, if the RAS idle bar signal RASIDLEB is disabled as a logic 'L' level.

The circuit shown in FIG. 8 is demonstrated as one exemplary embodiment of the above function. There can be various embodiments implementing the same function.

Referring to FIG. 8, a RAS idle bar signal RASIDLEB related to an operation of a memory device is a mixed signal by mixing signals from the RAS active signal RASATV of each bank. The RAS idle bar signal RASIDLEB is activated when an active command signal ACTIVE COMMAND for the memory device is inputted to the memory device and disabled when a precharge command is inputted. Therefore, the external input flag signal SAE_FLAGB is activated when a clock synchronizing signal SAE_CLK is activated after the active command signal ACTIVE COMMAND is inputted to the memory device, and then, the external input flag signal SAE_FLAGB is inactivated by a bit line precharge command signal BIT LINE PRECHARGE COMMAND.

Figure 10:
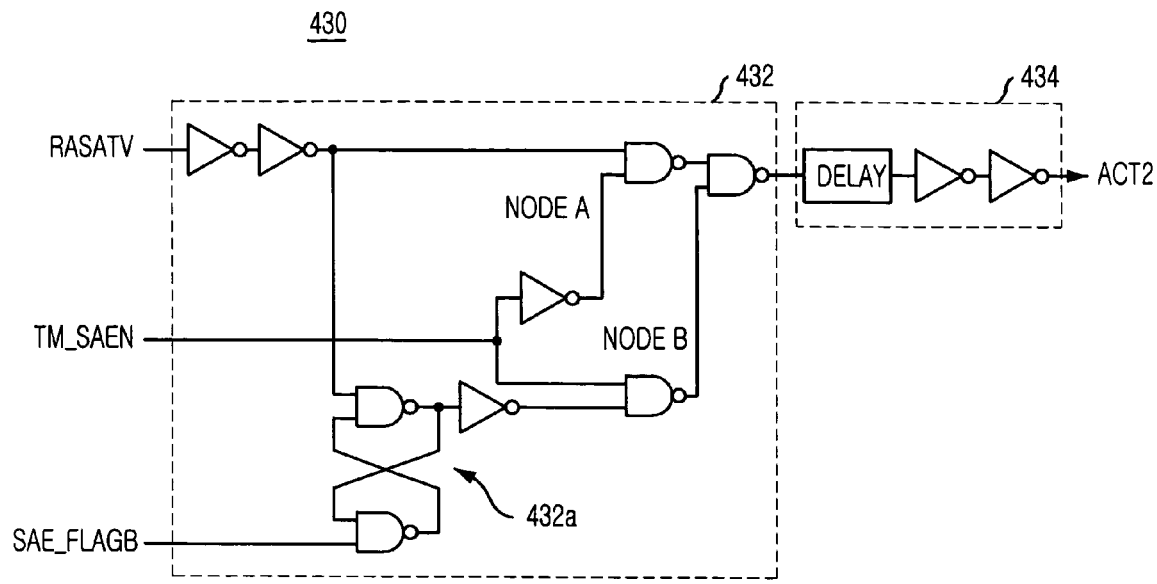
FIG. 10 is a schematic circuit diagram of a sensing margin time control unit shown in FIG. 5.

FIG. 10 is a schematic circuit diagram showing a sensing margin time control unit 430.

Figure 11:
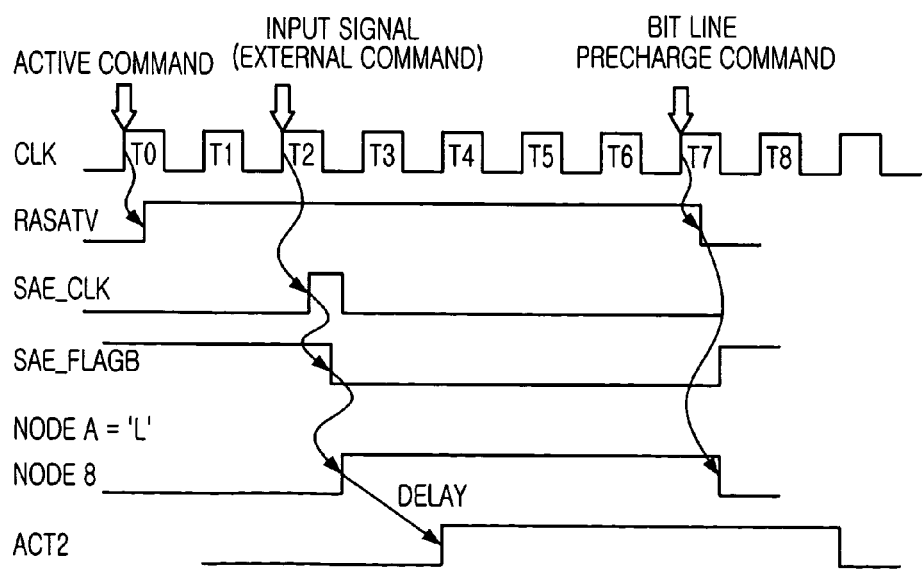
FIG. 11 is a timing diagram showing an operation of a sensing margin time control unit shown in FIG. 10.

FIG. 11 is a timing diagram demonstrating operation of the sensing margin time control unit shown in FIG. 10.

Referring to FIGS. 10 and 11, a sensing margin time control unit 430 includes a select unit 432 and a delay unit 434. The select unit 432 controlled by a test mode signal TM_SAEN selects and delivers one of a RAS active signal RASATV and an external input flag signal SAE_FLAGB. The delay unit 434 generates the third control signal ACT2 by delaying an outputted signal of the select unit 432.

When a test mode signal TM_SAEN is activated as a logic 'H' level, the third control signal ACT2 is activated as a logic 'H' level delayed from the point where an external input flag signal SAE_FLAGB is activated as a logic 'L' level.

Therefore, the third control signal ACT2 is determined depending on an external input signal.

Referring to FIG. 10, a flip flop 432A which receives a RAS active signal RASATV and an external input flag signal SAE_FLAGB makes a NODE B be disabled as soon as the NODE B gets a precharge command.

Figure 12A:
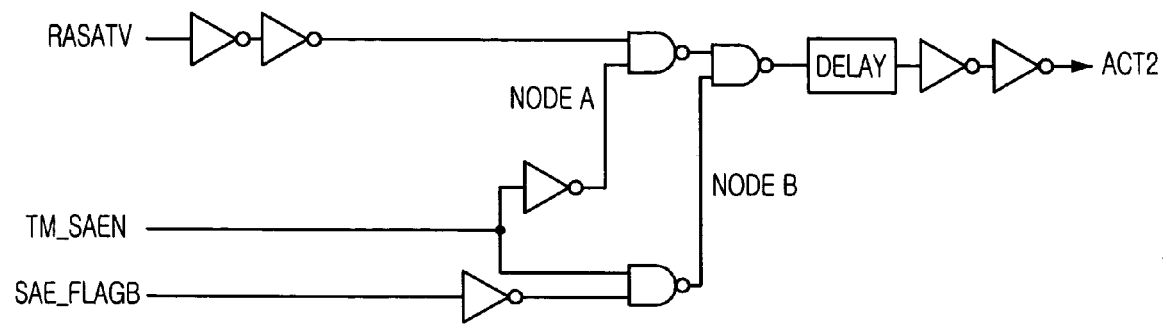
FIGS. 12A, 12B and 12C are schematic circuit diagrams of a sensing margin time control unit shown in FIG. 5.

It is also possible that a value of NODE B is determined by an external input flag signal SAE_FLAGB without an external input flag signal SAE_FLAGB in FIG. 12A.

Figure 12B:
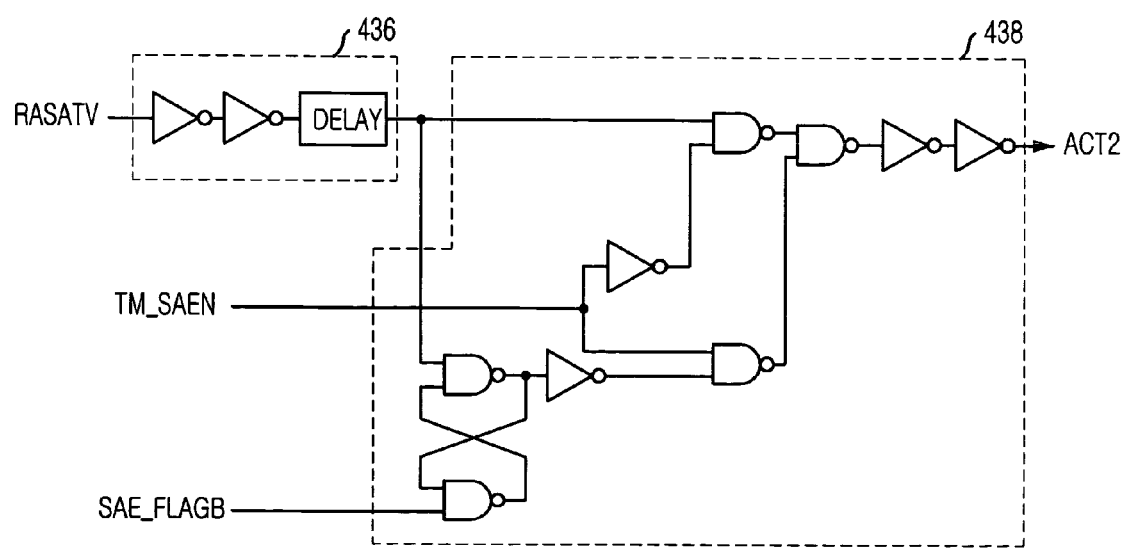
Figure 12C:
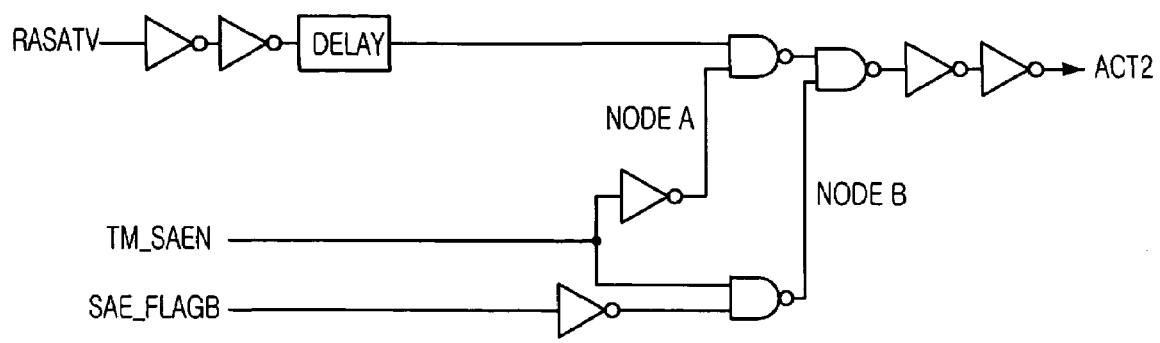

FIGS. 12B and 12C show two different embodiments of a sensing margin time control unit 430 including a delay unit 436 and a select unit 438.

The circuits of FIGS. 12B and 12C can be applied when a shorter sensing margin time than a normal sensing margin time is needed.

Figure 13:
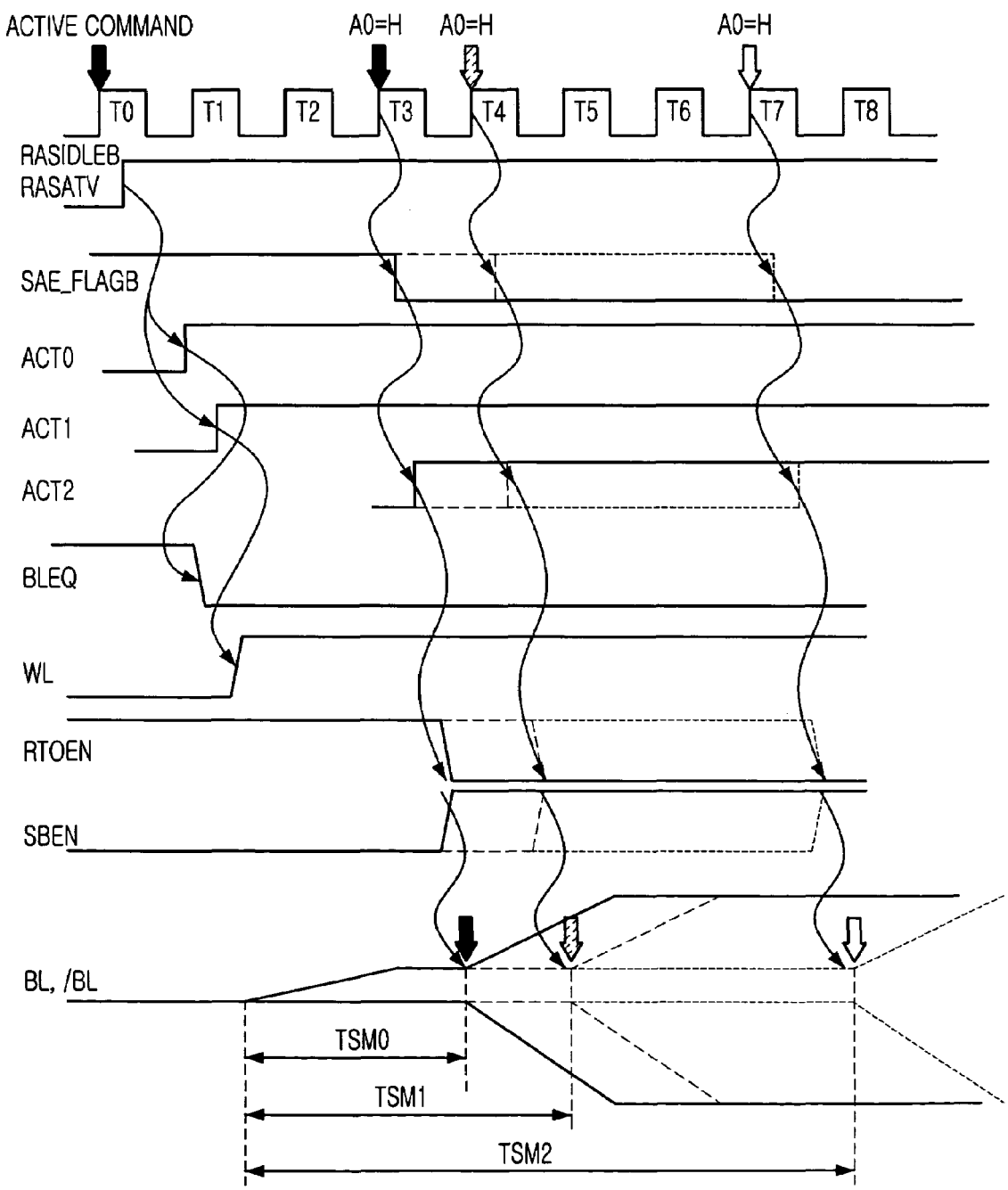
FIG. 13 is a timing diagram showing an operation of the semiconductor memory device in accordance with present invention in case of a test mode.

FIG. 13 is a timing diagram showing an operation of the present invention in case of a test mode.

As shown, a RAS active signal RASATV and a RAS idle bar signal RASIDLEB are activated as a logic 'H' level by the active command signal ACTIVE COMMAND.

After that, in response to a RAS active signal RASATV, a word line timing control unit 330 generates the second control signal ACT1 and a sense amplifier timing control unit 360 generates a first control signal ACT0.

In response to the second control signal ACT1, a row address signal ROWADD is decoded by a row decoder 340 and then a word line signal WL of a selected memory cell 350 is activated.

In a sense amplifier control unit 380, in response to the first control signal ACT0, a precharge control signal BLEQ is inactivated and a bit line is floated.

And then, data of a memory cell start to be loaded on a bit line.

If an external input signal (assumed address is A0) or an external mixed signal is inputted at T3, an external input flag signal SAE_FLAGB is activated through a clock synchronizing unit 410 and an external input flag signal generating unit 420.

After that, in a sensing margin time control unit 430, a third control signal ACT2 is activated by the external input flag signal SAE_FLAGB. Then, a first enable signal RTOEN and the second enable signal SBEN are activated by the third control signal act2 in a sense amplifier control unit 440.

Finally, a bit line pair BL and /BL starts to be amplified after a sensing margin time tSM0.

If the external signal is inputted at T4 or T7, a sensing margin time will be tSM1 or tSM2.

Therefore, according to the present invention, the semiconductor memory device can control the sensing margin time freely.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
a memory cell connected to a bit line and a word line;
a first means for loading data of the memory cell on the bit line in response to an activated word line;
a second means for amplifying the loaded data of the bit line in response to a sense amplifier enable signal; and
a third means for activating the sense amplifier enable signal to have a sensing margin time at a normal mode or to have an adjusted sensing margin time at a test mode,
wherein a length of the adjusted sensing margin time is determined by a timing when a predetermined input signal is inputted at the test mode.

2. The semiconductor memory device as recited in claim 1, wherein the third means includes:
a clock synchronizing unit which generates a clock synchronizing signal by synchronizing the predetermined input signal with a clock signal;
an external input flag signal generating unit which generates an external input flag signal in response to an outputted signal from the clock synchronizing unit, a test mode signal and a chip activating signal;
a sensing margin time control unit which generates a sensing margin time control signal in response to the chip activating signal at the normal mode or generates an adjusted sensing margin time control signal in response to the external input flag signal at the test mode; and
a sense amplifier control unit which generates the sense amplifier enable signal in response to an outputted signal from the sensing margin time control unit.

3. The memory device as recited in claim 2, wherein the sensing margin time control unit includes:
a delay unit which generates the sensing margin time control signal by delaying the chip activating signal at the normal mode or generates the adjusted sensing margin time control signal by delaying the external input flag signal or by buffering the external input flag signal without delaying.

4. The memory device as recited in claim 2, wherein the second means includes:
an amplifying unit for amplifying the bit line signal; and
an activating voltage generating unit for generating an activating voltage in response to the sense amplifier enable signal.

5. A method of amplifying a bit line of a semiconductor memory device, comprising the steps of:
loading data of a memory cell onto the bit line by floating the bit line and activating a word line;
operating a normal mode in which the semiconductor memory device starts to amplify the data of the bit line after a predetermined sensing margin time; and
operating a test mode in which the semiconductor memory device amplifies the data of the bit line after an adjusted sensing margin time,
wherein a length of the adjusted sensing margin time is determined by a timing when a predetermined input signal is inputted at the test mode.

6. The method of amplifying a bit line of a semiconductor memory device as recited in claim 5, wherein the step of operating the test mode includes a step of:
generating a clock synchronizing signal which is activated if the predetermined input signal is inputted;
generating a flag signal which is activated in response to the clock synchronizing signal and inactivated by a bit line precharge command;

generating a control signal by delaying the flag signal for a predetermined time; and generating a sense amplifier enable signal for generating an activating voltage for a bit line sense amplifier in response to the control signal; and starting to amplify data of the bit line in response to the sense amplifier enable signal.

7. The method of amplifying a bit line of a memory device as recited in claim 5, wherein the step of operating the test mode includes a step of:

generating a clock synchronizing signal which is activated if the predetermined input signal is inputted;

generating a flag signal which is activated in response to the clock synchronizing signal and inactivated by a bit line precharge command;

generating a control signal by buffering the flag signal without delaying;

generating a sense amplifier enable signal for generating an activating voltage for a bit line sense amplifier in response to the control signal; and starting to amplify data of the bit line in response to the sense amplifier enable signal.

8. A sensing margin time control device for controlling a sensing margin time of a bit line, comprising:

a clock synchronizing unit which generates a clock synchronizing signal by synchronizing a signal inputted from outside of a chip with a clock;

an external input flag signal generating unit which generates an external input flag signal in response to the clock synchronizing signal, a signal which determines an active section of a chip and a test mode signal; and a sensing margin time control unit which, in response to a test mode signal, generates a control signal responding to the external input flag signal in case of a test mode and generates a control signal responding to a signal which determines an active section of a bank in case of a normal mode.

9. The sensing margin time control device as recited in claim 8, wherein the clock synchronizing unit includes:

an internal clock generating unit which generates an internal clock from a clock of outside of a chip; and a clock synchronizing signal generating unit which synchronizes a signal from outside of a chip with the internal clock signal.

10. The sensing margin time control device as recited in claim 8, wherein the clock synchronizing unit includes:

an internal clock generating unit which generates an internal clock from a clock of outside of a chip;

an input unit which generates a mixed signal by mixing signals from outside of a chip; and a clock synchronizing signal generating unit which synchronizes the mixed signal with the internal clock signal.

11. The sensing margin time control device as recited in claim 8, wherein the external input flag signal generating unit generates an external input flag signal by latching a chip activating signal at a point of time when the clock synchronizing signal is activated in the test mode; and, then, disabled if the chip activating signal is disabled.

12. The sensing margin time control device as recited in claim 8, the sensing margin time control unit includes:

a means for selecting one of two signals which are a signal related to an active section of the bank and the external input flag signal in response to a test mode signal; and a delay unit which outputs a control signal by delaying the selected signal.

13. The sensing margin time control device as recited in claim 8, the sensing margin time control unit includes:

a delay unit which outputs a signal which delays the signal related to an active section of the bank and outputs the signal.

a means for selecting one of two signals which are an outputted signal of the delay unit and the external input flag signal.

14. The sensing margin time control device as recited in claim 8, wherein the signal related to an active section of a chip and the signal related to an active section of a bank have same timing.

* * * * *